United States Patent [19]
Miyagi et al.

[11] Patent Number: 5,370,371
[45] Date of Patent: Dec. 6, 1994

[54] HEAT TREATMENT APPARATUS

[75] Inventors: Katsushin Miyagi; Shingo Watanabe; Yuuichi Mikata, all of Kanagawa, Japan; Katsuya Okumura, Poughkeepsie, N.Y.

[73] Assignee: Tokyo Electron Kabushiki Kaisha, Tokyo To, Japan

[21] Appl. No.: 75,119

[22] Filed: Jun. 10, 1993

[30] Foreign Application Priority Data

Jun. 11, 1992 [JP] Japan ..................... 4-177427

[51] Int. Cl.⁵ .............................. C21D 1/06
[52] U.S. Cl. .................... 266/256; 118/724; 432/254.2
[58] Field of Search ............. 266/249, 251, 256; 432/202, 204, 206, 226, 231, 249, 254.2, 258; 118/715, 724, 728

[56] References Cited

U.S. PATENT DOCUMENTS

| | | | |
|---|---|---|---|
| 4,775,317 | 10/1988 | Schülke et al. | 432/254.2 |
| 4,989,543 | 2/1991 | Schmitt | 118/724 |
| 5,048,800 | 9/1991 | Miyazaki et al. | 266/256 |
| 5,127,365 | 7/1992 | Koyama et al. | 118/724 |

FOREIGN PATENT DOCUMENTS 57-51729  11/1982  Japan .

*Primary Examiner*—Scott Kastler
*Attorney, Agent, or Firm*—Beveridge, DeGrandi, Weilacher & Young

[57] ABSTRACT

A heat treatment apparatus having a heat treatment boat with a plurality of wafers held thereon, which is to be loaded in a reaction vessel which has one end opened. Once loaded, the boat effects a seal of the reaction vessel, in preparation for subjecting the wafers to heat treatment. The boat also has a heat-insulator disposed on its lower end for heat-insulating the interior of the reaction vessel during the heat-treatment. The heat-insulator includes composite plates having a metal film layer on an upper surface for reflecting heat rays generated during the heat treatment of the reaction vessel, and a cylinder enclosing the composite plates. Thus, sufficient heat-insulating effect for the heat treatment can be obtained, and stable heat-treatment can be conducted with the sufficient heat-insulating effect secured. Furthermore, the generation of particles can be suppressed, and yields of the heat treatment can be improved.

15 Claims, 5 Drawing Sheets

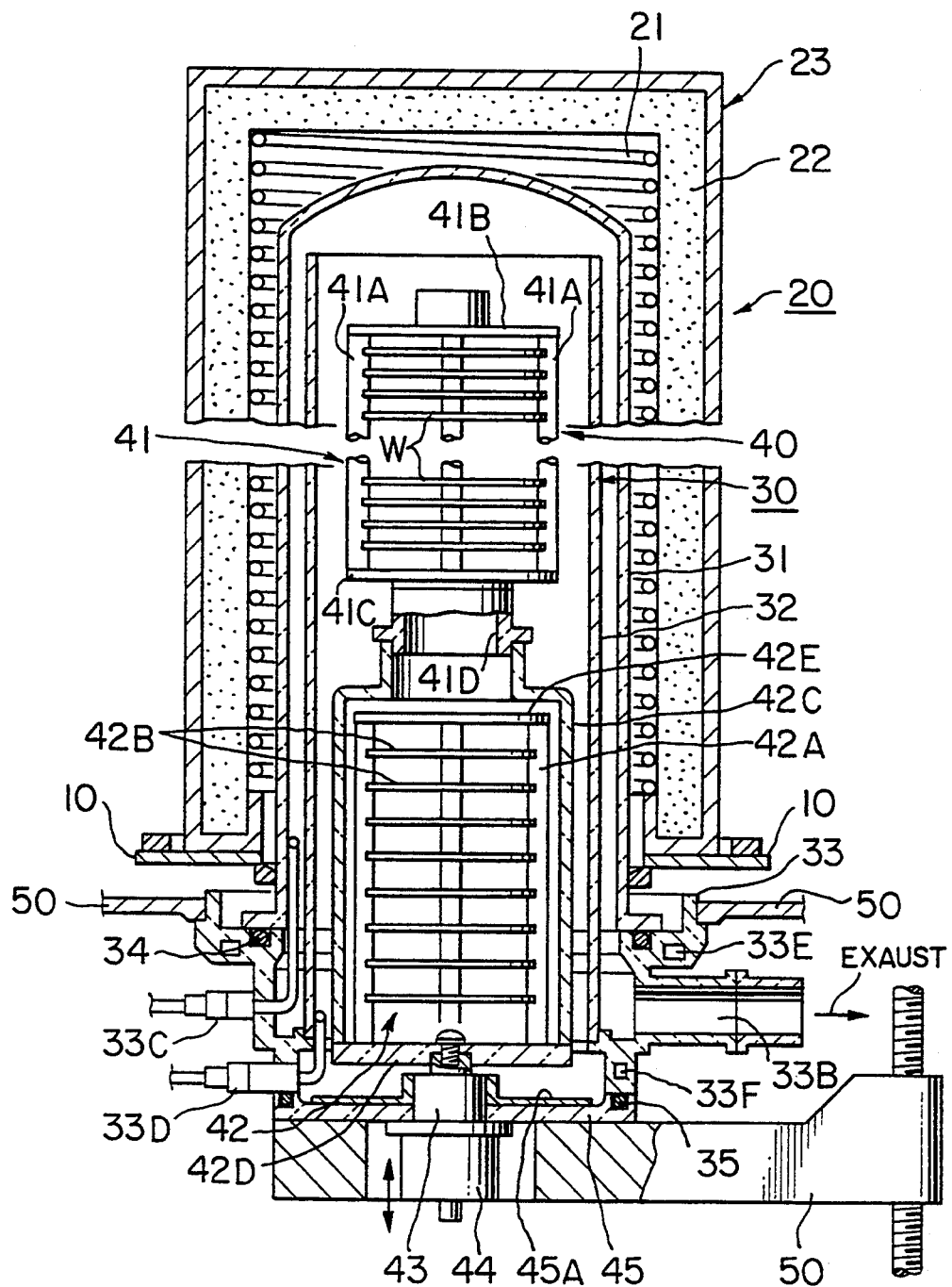
F I G. 1

HEAT TREATMENT APPARATUS

BACKGROUND OF THE INVENTION

This invention relates to a heat treatment apparatus for heat-treating an object to be treated, such as semiconductor wafers or others.

A conventional heat treatment apparatus of this kind is a low-pressure CVD apparatus including a heat treatment unit of, e.g., FIG. 7 (see e.g., specification of U.S. Pat. No. 5,048,800). This conventional heat treatment apparatus will be explained with reference to FIG. 7. As shown in FIG. 7, this low-pressure CVD apparatus comprises a heating furnace 20, a double-wall reaction vessel (tube) 30 of quartz housed in the heating furnace with the axis aligned with that of the heating furnace 20, and a heat treatment boat 40 for holding a plurality of wafers W to be heat-treated horizontal spaced vertically from each other, the heat treatment (wafer) boat being removably loaded into the reaction vessel 30. The heat treatment boat 40 is loaded into the reaction vessel 30 with the axis of the boat aligned with that of the vessel, and reaction gases are fed onto the surfaces of the wafers W held on the heat treatment boat 40 to form a nitrogen oxide or other films concurrently on the surface of each wafer W.

The reaction vessel 30 comprises a double-wall vessel including an outer cylinder 31 having only the lower end opened, and an inner cylinder 32 inserted in the outer cylinder 31 conically with the latter, a manifold 33 connected to the lower end of the double-wall vessel. The manifold 33 engages with the flange of the heat treatment boat 40 to seal the reaction vessel 30 to retain the interior of the reaction vessel 30 under a required low pressure.

The heat treatment boat 40 comprises a wafer holder 41 having a plurality of grooves for holding a plurality of wafers W vertically spaced from each other, and a heat insulator 70 for insulating the interior of the reaction vessel 20 from the outside to maintain the interior of the vessel 20 at a constant temperature.

This heat insulator 70 comprises a support 70A made of a plurality of support rods 70A, four mounts 70B of quartz each supported by the support at positions a little inner of the peripheral edge, vertically spaced from each other, a cylinder 70C of the same material as the mounts 70B surrounding the mounts 70B, and a seat bearing the support 70A, the mounts 70B and the cylinder 70C. The heat-insulator 70 is closed at the upper end with a disk on the lower end of the wafer holder 41, and closed at the lower end with the seat 70D.

In the conventional low-pressure CVD apparatus of FIG. 7, the mounts 70B and the cylinder 70C of the heat insulator 70 are made of opaque quartz or opaque quartz having the surface treated with sand blasts or others for the prevention of heat rays from the heat insulator 70, whereby the heat insulating efficiency is enhanced. Cooling water is caused to flow through the passage of the manifold 33 for the suppression of temperature rises of the manifold 33. But the cooling water flowing through the passage is not sufficient to cool the manifold 33 because opaque quartz of the mounts 70B cannot sufficiently repel the heat rays in the reaction vessel 30. Temperature increases thermally degrade the O-rings near the passage and gradually evaporate a magnetic fluid in the magnetic seal unit, with the result that the sealing at the respective parts is deteriorated. This has been a problem. A 200°-500° C. area is formed in the upper part of the heat insulator. Grown films in this area have poor adhesion. Gas flows whose velocity is near the acoustic velocity are generated around the heat insulator 70 in a 1 Torr-vacuum. These gas flows peel off the films of poor adhesion into particles, which lower yields of the heat treatment.

The conventional low-pressure CVD apparatus including an evacuated heat insulator has high heat insulation, but the evacuation portion of the hollow vessel which is the heat insulator sometimes has imperfect sealing. Air leaks through the imperfectly sealed evacuation portion to impair film forming reactions, lower the heat insulation, or cause cracks in the evacuation portion, damaging the heat insulator. This heat insulator has such good heat insulation that a temperature of the manifold 33 and the sealing flange are maintained below 100°-150° C. to thereby prevent the thermal degradation of the O-rings, but reaction gases, such as ammonium and dichlorosilane, etc., tend to have side reactions to generate particles, as of ammonium chloride, etc. The particles lower yields of the heat treatment, and especially in micron-processing of submicrons, such as 4MDRAM, on semiconductor wafers, these particles affect the film formation. This is also a problem.

Furthermore, thermal convection occur in the reaction vessel 30 due to a large temperature difference between the heat treatment section and the low-temperature area, and break temperature uniformity in the heat treatment section. A problem is that homogeneous films cannot be formed.

SUMMARY OF THE INVENTION

This invention was made to solve the above-described problems, and an object of this invention is to provides a heat treatment apparatus which can provide sufficient heat insulating effect necessary for heat treatment and can conduct stable heat treatment with the heat insulating effect, and can suppress the generation of particles to improve yields of the heat treatment.

A heat treatment apparatus according to this invention including a holder to be loaded into a reaction vessel having the lower end opened, with a plurality of objects to be heat treated held on, and seal the reaction vessel, and subject the objects to heat-treatment; and a heat insulator disposed on the lower end of the holder for heat-insulating the reaction vessel in the heat-treatment, the heat insulator comprising composite plates each including a reflecting surface for reflecting heat rays generated during the heat treatment to the interior of the reaction vessel, and a cylinder enclosing the composite plates.

A heat treatment apparatus according to this invention including a holder to be loaded into a reaction vessel having the lower end opened, with a plurality of objects to be heat treated held on, seal the reaction vessel, and subject the objects to heat-treatment, and a heat insulator disposed on the lower end of the holder for heat-insulating the reaction vessel in the heat-treatment, the heat insulator comprising composite plates each including a metal film layer for reflecting heat rays generated during the heat treatment to the interior of the reaction vessel, and a protection film layer for protecting the metal film layer.

In the heat treatment apparatus according to this invention, when the holder is loaded in the reaction vessel with the opened end of the reaction vessel closed, and a heat-treating operation is conducted, heat rays in the reaction vessel are reflected on the metal film layers of the composite plates to the interior of the reaction vessel, whereby the interior of the vessel is heat-insulated at the outside. Accordingly temperature increases near the heat insulator are suppressed to prevent damages of the seal mechanism near the heat insulator, so that a low-pressure in the reaction vessel is stabilized, and the generation of particles due to fed gases is prohibited. Furthermore, the cylinder can regulate directions of the air flows near the heat insulator.

Furthermore, in the heat treatment apparatus according to this invention, when the holder is loaded in the reaction vessel with the opened end of the reaction vessel closed, and a heat-treating operation is conducted, heat rays in the reaction vessel are reflected on the metal film layers to the interior of the vessel so as to heat-insulate the reaction vessel at the outside. Accordingly temperature increases near the heat insulator are suppressed to prevent damages of the seal mechanism near the heat insulator, so that a low-pressure in the reaction vessel is stabilized, and the generation of particles due to fed gases is prohibited. Furthermore, the protection film layers hinder the adhesion of heavy metal vapor generated in the heat-treatment to the objects to be heat-treated, while the degradation of the metal film layers can be prevented.

BRIEF DESCRIPTION OF THE DRAWINGS

FIG. 1 is a vertical sectional view of a major part of the heat treatment apparatus according to one embodiment of this invention.

DETAILED DESCRIPTION OF THE PREFERRED EMBODIMENTS

Figure 2:
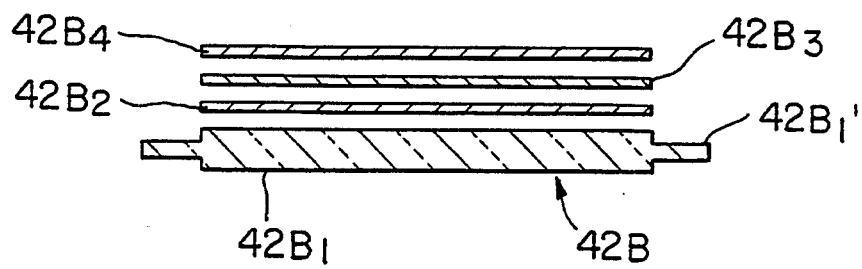
FIG. 2 is a broken vertical view of an example of the composite plate used in the heat insulator of the heat treatment apparatus of FIG. 1.

The heat treatment apparatus according to one embodiment of this invention will be explained with reference to FIGS. 1 to 6.

As in FIG. 1, the heat treatment apparatus according to this embodiment comprises a heating furnace 20 disposed vertical on a base 10 which is mounted on a frame, a double-wall vessel or tube (hereinafter called "reaction vessel" in this embodiment) inserted in the heating furnace 20 with the axis aligned with that of the heating furnace 20, and having one end opened, and holder (wafer boat) (hereinafter called "heat-treatment boat" in this embodiment) which is removably loaded in the reaction vessel 30, sealing the reaction vessel 30 for subjecting a plurality (e.g., 100–150 sheets) of objects to be heat-treated (e.g., semiconductor wafers, hereinafter called "wafers" in this embodiment. The heat-treatment boat 40 is moved in the direction indicated by the arrows by a lift mechanism 50, and when wafers W are heat-treated, the heat-treatment boat 40 is lifted by the lift mechanism 50 to be loaded into the reaction vessel 30. When the heat-treatment is over, the heat-treatment boat 40 is moved down by the lift mechanism (elevator) 50 to be unloaded from the reaction vessel 50.

The heating furnace 20 is in the shape of a cylinder having the upper end closed and the lower end opened. As in FIG. 1, the heating furnace 20 comprises a resistor heater 21 in the form of a coil provided along the inside surfaces of the straight sides thereof, a heat-insulating material 22 holding the resistor heater 21 and covering the inside surfaces of the straight sides and all the insider surface of the upper end portion of the cylinder, and a shell of, e.g., stainless covering the entire outside surface of the heat-insulating material 22. The resistor heater 21 stably heats a uniform-temperature area of the reaction vessel 30 over an entire length thereof up to a required temperature for the heat-treatment of the wafers W, e.g., 500°–1200° C., and maintains the temperature for the heat-treatment of the wafers W.

As in FIG. 1, the reaction vessel 30, which is inserted in the heating furnace with the axis aligned with that of the latter has a double-wall structure constituted by an outer cylinder 31 of a highly heat-resistant and anticorrosive material, such as quartz, having the upper end closed and the lower end opened, and by an outer cylinder of the same highly heat-resistance and anticorrosive material as the outer cylinder 31 inserted in the outer cylinder 31 coaxially therewith at a certain interval therefrom. The reaction vessel 30 further includes a manifold 33 of a metal, such as stainless steel, supported by a wall 50 which constitutes a double-wall together with the base 10. The manifold 33 is engaged with the lower end of the outer cylinder 31 in close contact therewith, and bears the inner cylinder 32 at an extension 33A horizontally extended from the inside surface thereof.

The manifold 33 includes an exhaust pipe 33B connected to an exhaust system, e.g., a vacuum pump or others, for evacuating the interior of the reaction vessel 30, and a gas feed pipe 33C and a source gas feed pipe 33D which are communicated with the outside at circumferentially offset positions from the exhaust pipe 33B. The gas feed pipe 33C is made of a highly heat-resistant and anticorrosive material, such as quartz and bent upward along the inside circumferential surface of the outer cylinder 31 for infeeding a purging gas, such as nitrogen or others. The source gas feed pipe 33D is made of a heat-resistant and anticorrosive material, such as quartz, and bent upward along the inside circumferential wall of the inner cylinder 32 for infeeding source gases (for, e.g., film forming). In a heat-treating operation, reactive source gases (process gases), e.g., dichlorosilane, ammonium, etc., are fed through the source gas feed pipe 33D, so that through the reaction of these gases thin films, such as nitrogen oxide film or others, are formed on the surfaces of the wafers W.

The manifold 33 has passages 33E, 33F for cooling water to flow through in a circumferential direction thereof, which (passages) are provided respectively in a flange on the upper end portion thereof and in a thicker portion on the lower end portion thereof. The cooling water flowing through the passages 3E, 33F cools the manifold 33 heated in a heat-treating operation so as to preclude the thermal degradation of O-rings 34, 35 near the passages 33E, 33F.

The heat-treatment boat 40 to be loaded in and unloaded from the reaction vessel 30 is formed of a heat-resistant and anticorrosive material, such as quartz. The boat 40 comprises a wafer holder 41 having a plurality of grooves (e.g., 100–150 grooves) vertically spaced equidistantly from each other, a heat-insulator 42 disposed on the lower end of the wafer holder 41, a magnetic seal shaft 43 connected to the center of the underside of the heat insulator 42, and a cap 45 of, e.g., stainless steel or others with a magnetic seal unit 44 secured to which is interconnected to the magnetic seal shaft 43. The heat-treatment boat 40 is rotated through a magnetic fluid in the magnetic seal unit 44 when loaded in the reaction vessel 30. The inside surface of the cap 45 is coated with ceramics 45A, such as quartz, so that no particles are generated from the cap in heat-treating operations.

The wafer holder 41 comprises four, for example, wafer holding rods 41A having the above-mentioned grooves, and a pair of discs 41B, 41C secured respectively to the upper and the lower ends of the wafer holding rods 41A circumferentially spaced equidistantly from each, and a cylinder 41D with a flange fixed to the lower disc 41C. The cylinder 41D is inserted in the upper end of the heat insulator 42.

The heat insulator 42 with the wafer holder 41 inserted in is a major part of this invention. As in FIGS. 1 and 4, the heat insulator 42 comprises a support 42A made of a plurality of support rods, a cylinder or other; a cylinder 42C enclosing the support member 42A, which includes 4 sheets, for example, of composite plates 42B each supported horizontal by the support member 42A vertically equidistantly from each other and including a metal film layer, and grooves 42F for supporting the composite plates 42B in the same way as the wafers W and which is made of ceramics, such as quartz; and a base 42D for bearing all these members. The heat insulator 42 functions to heat-insulate the interior of the reaction vessel 30 from the outside. At least one sheet of composite plate 42B can achieve the heat-insulating effect.

Figure 3:
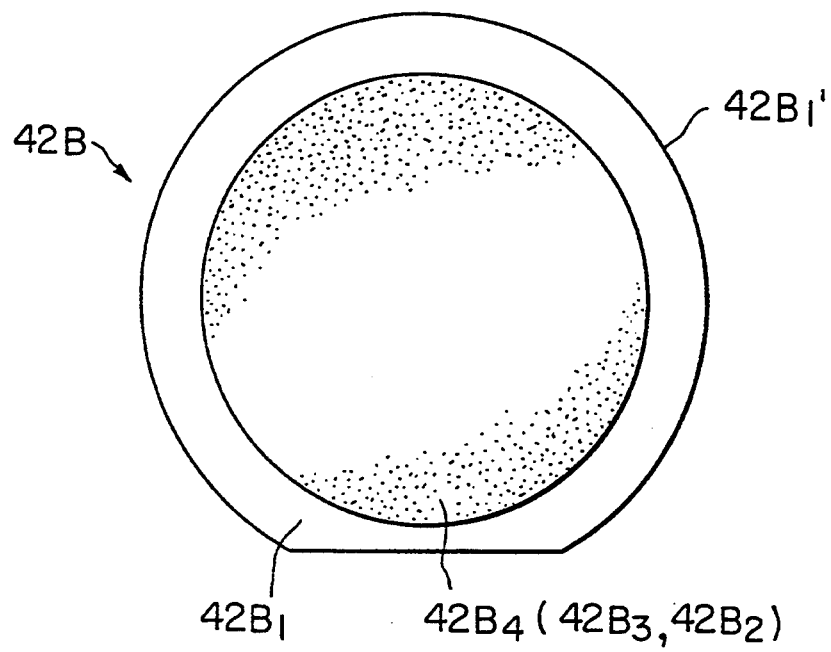
FIG. 3 is a plan view of the composite plate of FIG. 2.
Figure 4:
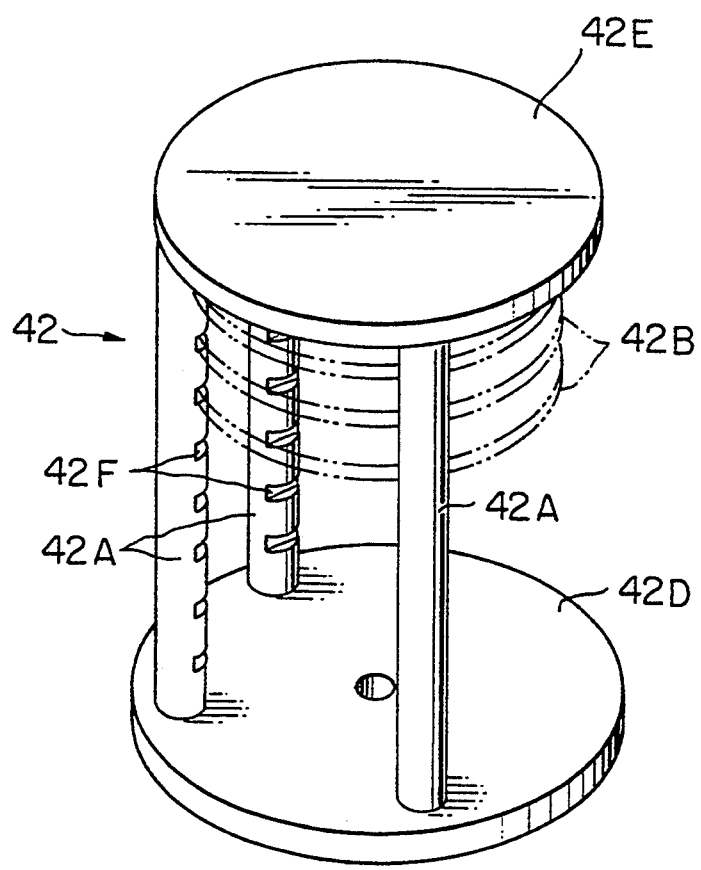
FIG. 4 is a perspective view of a support of the composite plates of the heat treatment apparatus of FIG. 1.

As in FIGS. 2 and 3, each composite plate 42B used in this invention comprises a substrate $42B_1$ (of, e.g., a 3 mm-thickness) made of ceramics, such as quartz, silicon carbide or others, a base film layer $42B_2$ of ceramics, such as silicon carbide and others, or a metal formed on the upper surface of the substrate $42B_3$ of a metal, such as aluminium or others, for radiating heat rays in the reaction vessel 30 in a heat-treating operation inside the reaction vessel 30, and a protection film layer $42B_4$ formed on the metal film layer $42B_3$, protecting the metal film layer $42B_3$ and made of a material, such as ceramics, e.g., silicon carbide or others, which does not easily generate particles. The protection film layer $42B_4$ functions to prevent particles of heavy metals, etc. generated in the reaction vessel 30 in heat-treating operations from adhering to the metal film layer $42B_3$. The substrate $42B_1$ has a thinner portion $42B_1$, formed on the peripheral edge, and the thinner portion $42B_1$, is supported in a groove 42F in the support 42A. On the thicker portion inside the thinner portion $42B_1$, are formed the respective film layers $42B_2$, $42B_3$, $42B_4$ one on another.

Figure 5:
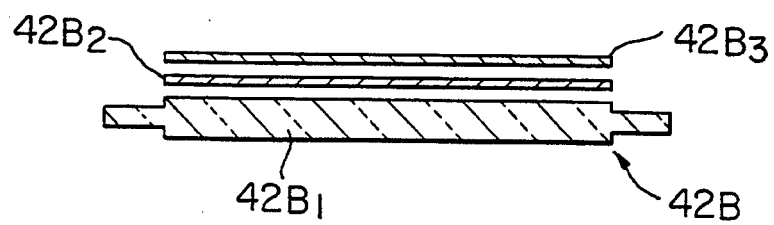
FIG. 5 is a broken vertical view of another example of the composite plate of the heat insulator.

The composite plate 42B may have the laminar structure of, e.g., FIG. 5. As in FIG. 5, this composite plate comprises a substrate $42B_1$ of transparent quartz, a base film layer $42B_2$ of a metal, such as chromium or others, formed on the upper surface of the substrate $42B_1$, and a metal film layer $42B_3$ of a metal, such as gold or others, formed on the upper surface of the base film layer $42B_2$.

It is preferable that the metal film layer $42B_3$ is formed of a metal which does not easily generate particles at a heating temperature for the heat-treatment, and is made of a metal which radiate heat rays. Such metal is can be optionally selected out of metals of high melting points, such as aluminium, gold, titanium (titanium nitride), tungsten, etc. A thickness of the metal film layer $42B_3$ differs depending on its used metal but must be enough (e.g., 1 $\mu$m) for the metal to effectively radiate heat rays. Thicknesses of the base film layer $42B_2$(e.g., 0.1 $\mu$m), and of the protection film layer $42B_4$ (e.g., 0.01 $\mu$m) are not limited as long as they can do their functions. It is preferable that the respective layers $42B_2$, $42B_3$, $42B_4$ do not much differ from one another in their coefficients of linear expansion at a heating temperature in the heat-treatment. It is preferable to rinse the heat-insulator 42 that the protection film layer $42B_4$ is made of chemical resistant materials.

To be more specific, the composite plate 42B of FIG. 3 has the metal film layer $42B_3$ formed of, e.g., aluminium in a 3000–6000 Å film thickness, and the base film layer $42B_2$ and the protection film layer $42B_4$ formed of silicon nitride in a 2000–100000 Å film thickness. The composite plate of FIG. 4 has the metal film layer $42B_3$ formed of gold in a 2600 Å-thickness and the base film layer $42B_2$ formed of chromium in a 150 Å-thickness.

The substrate $42B_1$ may be substituted by a circular glass substrate, or a wafer (of e.g., a 0.75 mm-thickness) with the protection film formed on. This substitution reduces fabrication costs of the composite plate.

Then, the operation for forming silicon nitride films on wafers W using the heat-treatment apparatus according to this invention will be explained. The interior of the reaction vessel 30 is set at 700°–800° C. by the heating furnace 20, while the heat treatment boat 40 is loaded in the reaction vessel 30 sealed with the cap 45 as on FIG. 1. Subsequently the air in the reaction vessel 30 is evacuated through the exhaust pipe 33B, and the interior of the reaction vessel 30 is kept under a reduced pressure. Ammonium, dichlorosilane as source gases are fed into the reaction vessel 30 through the source gas feed pipe 33D to form silicon nitride films on the surfaces of the wafers W by the reaction between the ammonium and the dichlorosilane. During this film formation, the metal film layers $42B_3$ making up the composite plates 42B of the heat insulator 42 radiate the heat rays in the reaction vessel 30 without failure to the interior of the vessel 30 for the prohibition of the transmission of the heat rays, whereby the heat insulator 42 heat-insulates the interior of the reaction vessel 30 on the outside so as to hinder the heat rays from reaching the manifold 33. Cooling water is caused to flow through the passages 33E, 33F to sufficiently cool the manifold 33 so as to preclude the thermal degradation of the O-rings 34, 35 without failure. When this film formation is over, an inert gas, e.g., purging nitrogen or others, is fed through the gas feed pipe 33C to replace the gas in the reaction vessel with the inert gas, while the lower pressure in the reaction vessel 30 is returned to the atmospheric pressure. Then the heat-treatment boat 40 is unloaded from the reaction vessel 30.

As described above, according to this embodiment, the metal film layers $42B_3$ making up the composite plates 42B of the heat insulator 42 can sufficiently provide the heat insulating effect in a heat treating operation. Accordingly heat increases of the manifold 33 can be suppressed, and the manifold 33 can be sufficiently cooled by the cooling water alone. As results, the thermal degradation of the O-rings 34, 35 can be prevented, and the evaporation of the magnetic fluid from the magnetic seal unit 45 can be prevented. Thus, stable heat treatment can be conducted without impairing the sealing at these parts. According to this embodiment, the heat insulation by the heat-insulator 42 is never excessive, and accordingly the generation of particles, side products of the reaction gases, is prevented, and yields of the heat-treatment can be raised. If heavy metals, etc. stay on the heat-insulator 42 during repeated heat treating operations, the heat-insulator 42 can be rinsed with a rinse agent, such as hydrofluoric acid.

In the heat-treating apparatus according to this invention, the heat-insulator 42 may omit the cylinder 42C, but include the support 42A and the support 42A. In this case, it is preferable that the support 42C is formed not in a fin but in a cylindrical shape which precludes turbulent air flows in terms of prevention of the generation of particles.

Figure 6:
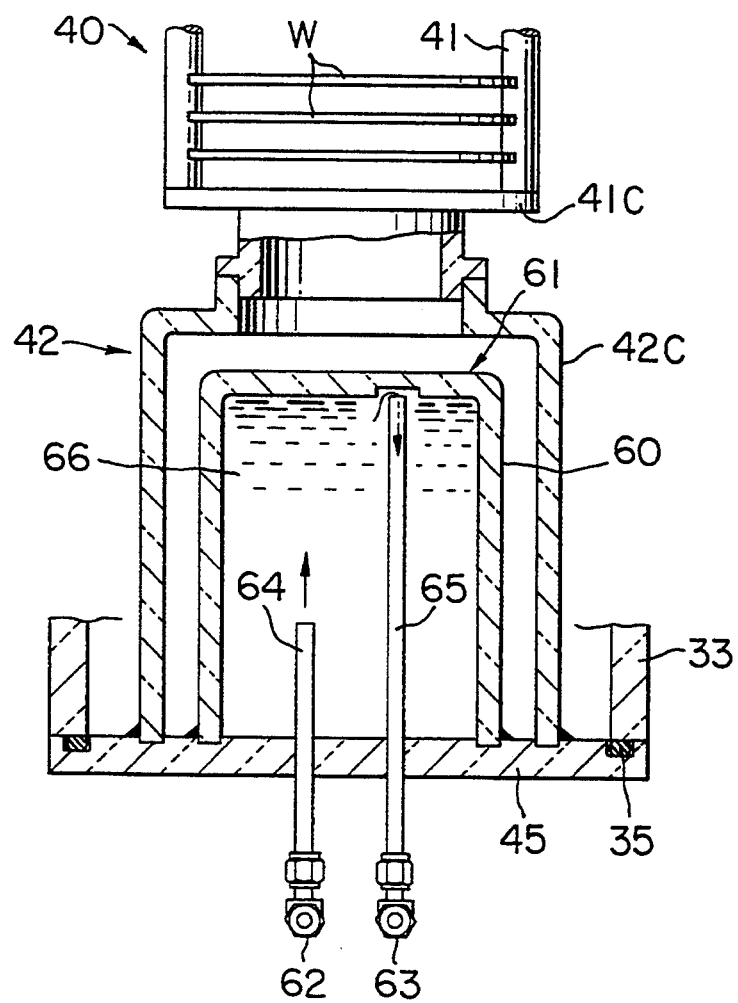
FIG. 6 is a vertical sectional view of another example of the heat insulator of the heat treatment apparatus according to this invention.
Figure 7:
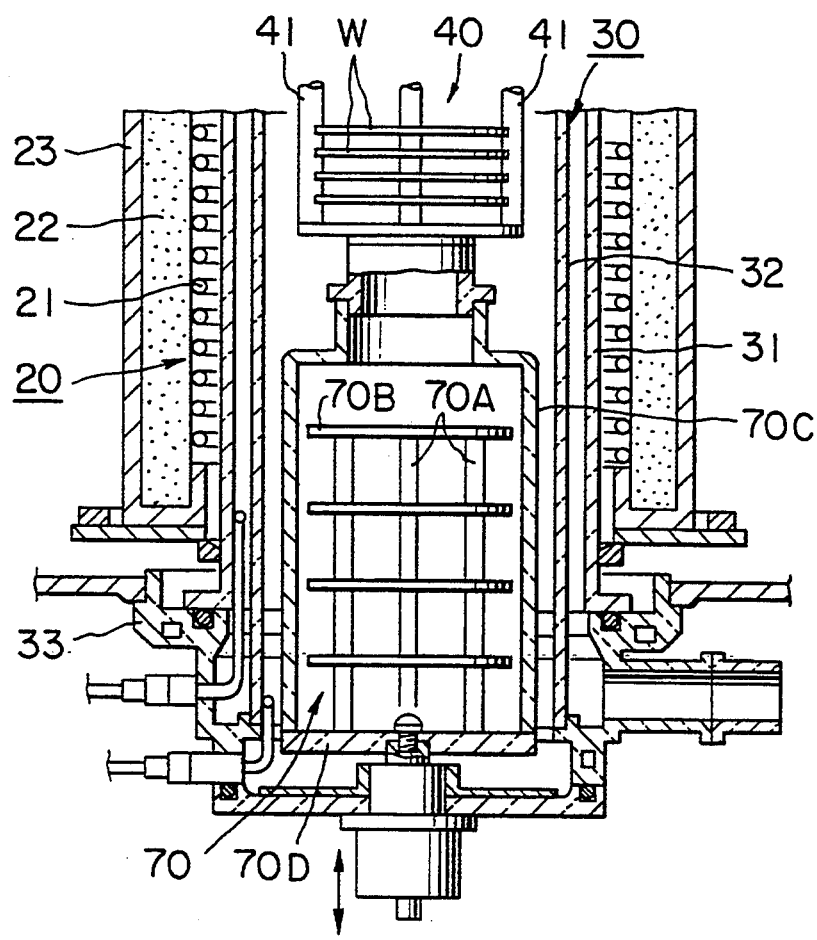
FIG. 7 is a vertical sectional view of a major part of the conventional heat treatment apparatus.

The heat-insulator 42 may comprise, as in FIG. 6, a reflection cylinder (closed body) 60 of aluminium formed integral with the cap 45 and having the upper end closed, and a cylinder 42C disposed outside the reflection cylinder 60 conically therewith. In this case, a hollow part 66 in the reflection cylinder 60 is fed with cooling water through a feed pipe 64 via union elbows 62, 63 of water feed means, and the cooling water is caused to overflow through an overflow pipe 65. Thus, coupled with the heat reflection again the reflection surface 61 of the reflection cylinder 60, the cooling water suitably cools the heat insulator 42.

In the above-described embodiments, the heat treatment apparatus according to this invention are explained by means of a low-pressure CVD apparatus. But this invention is not limited to those embodiments. As long as a heat treatment apparatus uses an heat-insulator including composite plates comprising metal films for reflecting heat rays generated in a heat treating operation to the interior of the reaction vessel, this invention is applicable to heat-treatment apparatuses widely ranging from atmospheric pressure CVD apparatuses, oxidation apparatuses, diffusion apparatuses, etc. The laminar structure of the composite plates can be optionally design-changed.

What is claimed is:

1. A heat treatment apparatus comprising:
a reaction vessel having an open lower end;
an object holder for holding a plurality of objects to be heat treated, said holder being moveable into said reaction vessel whereby said holder effects a seal of said reaction vessel; and
a heat insulator portion disposed at a lower end of said object holder, said heat insulator comprising a cylinder enclosing at least one composite plate, said plate comprising a base layer formed on a substrate, and a reflective layer formed on said base layer said reflective layer for reflecting.

2. A heat treatment apparatus comprising:
a holder to be loaded into a reaction vessel, said reaction vessel having lower end opened, said holder having a plurality of objects to be heat treated held thereon and, when placed in said reaction vessel, effecting a seal of the reaction vessel so as to subject the objects to heat-treatment;
a heat-insulator disposed at a lower end of the holder for heat-insulating the reaction vessel from the heat-treatment reaction vessel; and
said heat-insulator having at least one composite plate disposed therein, and said plate having a reflecting surface for reflecting heat rays radiated during the heat treatment of the objects in the reaction vessel.

3. A heat treatment apparatus comprising:
a holder to be loaded into a reaction vessel, said reaction vessel having a lower end opened, said holder having a plurality of objects to be heat treated held thereon and, when placed in said reaction vessel, effecting a seal of the reaction vessel so as to subject the objects to heat-treatment;
a heat-insulator disposed at a lower end of the holder for heat-insulating the reaction vessel from the heat-treatment reaction vessel; and
said heat-insulator further comprising a cylindrical closed body having a reflecting surface for reflecting heat rays radiated during the heat treatment of the objects in the reaction vessel; and
means for feeding cooling water through a passage formed in proximity to an O-ring used to seal said apparatus.

4. A heat treatment apparatus according to claim 1, wherein the composite plate comprises a substrate, a base protect metal base substrate film layer laid on the substrate, a metal film layer laid on the base film layer, and a protection film layer laid on the metal film layer, the metal film layer providing the reflecting surface.

5. A heat treatment apparatus according to claim 1, further comprising support means for supporting a plurality of the composite plates in a horizontal orientation, wherein said plates are disposed vertically equidistant from each other.

6. A heat treatment apparatus according to claim 1, wherein the composite plates are removably disposed in the heat insulator.

7. A heat treatment apparatus according to claim 1, wherein each composite plate has a thinner portion on peripheral edge by which the plate is to be supported.

8. A heat treatment apparatus according to claim 1, wherein the reaction vessel is is vertically oriented.

9. A heat treatment apparatus according to claim 1, wherein the heat treatment apparatus is a low-pressure CVD apparatus.

10. A heat treatment apparatus according to claim 4, wherein said substrate is comprised of a material selected from the group consisting of ceramics, quartz, and silicon nitride.

11. A heat treatment apparatus according to claim 4, wherein said substrate is formed of glass.

12. A heat treatment apparatus according to claim 4, wherein said object is a semiconductor wafer.

13. A heat treatment apparatus according to claim 4, wherein said base film layer is comprised of a material selected form the group consisting of ceramics, silicon nitride and metal.

14. A heat treatment apparatus according to claim 4, wherein the metal film layer is formed of aluminium.

15. A heat treatment apparatus according to claim 4, wherein the protection film layer is comprised of a material selected from the group consisting of ceramics, and silicon nitride.

* * * * *